United States Patent [19]
Kochpatcharin et al.

[11] Patent Number: 5,844,818
[45] Date of Patent: Dec. 1, 1998

[54] METHOD FOR CREATING AND USING DESIGN SHELLS FOR INTEGRATED CIRCUIT DESIGNS

[75] Inventors: Dan Kochpatcharin, Union City; Zarir B. Sarkari, San Jose; Christian Joly, Palo Alto; Allen Wu, Milpitas, all of Calif.

[73] Assignee: LSI Logic Corporation, Milpitas, Calif.

[21] Appl. No.: 627,823

[22] Filed: May 10, 1996

[51] Int. Cl.⁶ .................................................. G06F 9/455
[52] U.S. Cl. .......................... 364/578; 364/488; 364/489; 364/490
[58] Field of Search ..................... 364/578, 488, 364/489, 499, 491; 395/500

[56] References Cited

U.S. PATENT DOCUMENTS

| | | | |
|---|---|---|---|
| 4,882,690 | 11/1989 | Shinsha et al. | 364/490 |
| 5,095,454 | 3/1992 | Huang | 364/578 |
| 5,475,605 | 12/1995 | Lin | 364/488 |
| 5,572,437 | 11/1996 | Rostoker et al. | 364/489 |
| 5,598,344 | 1/1997 | Dangelo et al. | 364/489 |

*Primary Examiner*—Kevin J. Teska
*Assistant Examiner*—Matthew Clay Loppnow
*Attorney, Agent, or Firm*—Oppenheimer, Wolff & Donnelly; Claude A. S. Hamrick; Emil C. Chang

[57] ABSTRACT

A method for creating a shell to represent a functional block of an IC design comprising of a plurality of interconnected functional blocks. The critical information from a synthesized gate level block is retained in the shell such that when analyzing the static characteristics of another block connected to the block now represented by the shell the analysis is still accurate. At a hierarchial level the present invention provides a method for analyzing the functional blocks of an IC design such that the memory requirement for storing the information of the functional blocks of the IC design is reduced as well as a decrease in run time.

9 Claims, 8 Drawing Sheets

5,844,818

METHOD FOR CREATING AND USING DESIGN SHELLS FOR INTEGRATED CIRCUIT DESIGNS

BACKGROUND OF THE INVENTION

1. Field of the Invention

This invention generally relates to methods for verifying circuit designs for integrated circuits (IC), and in particular, to a method for creating and using design shells to represent functional blocks of an IC design in the rule checking process of the IC design.

2. Description of the Prior Art

The IC design of a computer chip is typically divided into several interconnected functional blocks where each block contains the circuitry for one part of the design. In the rule checking phase of an IC design, each functional block undergoes a design rule checking process in order to verify adherence to good design practices. In this process, the circuitry within each block is checked against design rules. The circuitry is also checked against the circuitry of the interconnected blocks to a certain extent in order to verify compliance of the design rules with these blocks as a group. Upon completion of this process for a group of interconnected blocks at a hierarchical level, these blocks are combined into one or more blocks. This process of rule checking smaller interconnected blocks to form larger interconnected blocks continues until there is one overall block for the IC design of the chip.

The problem with this prior art process is that when a block undergoes the rule checking process, all the circuitry information from the connected blocks must be made available in order to rule check the block. Consequently, this process requires a large amount of computer memory to store all the information from all the connected blocks and a very fast computer (or long run time) to process all the data from all the blocks.

SUMMARY OF THE INVENTION

It is therefore an object of the present invention to provide a method for creating and using a shell to retain critical information from a functional block of an IC design where the shell represents the functional block in the rule checking process of other connected blocks.

It is another object of the present invention to provide a method for creating and using a shell such that in the static rule checking process of another block connected to the created shell, the rule checking process would still be valid.

It is still another object of the present invention to provide a method for creating and using shells representing functional blocks of an IC design such that a minimum amount of memory is required to process the functional blocks.

It is still another object of the present invention to provide a method for creating and using shells representing functional blocks of an IC design such that a shorter computer run time is obtainable in rule checking all the blocks of the IC design.

Briefly, a preferred embodiment of the present invention is a method for creating and using a shell representing a functional block of an IC design, where the critical information from a synthesized gate level block is retained in the shell such that when analyzing the static characteristics of another block connected to the block now represented by the shell the analysis remains accurate.

At a hierarchial level the present invention provides a method for analyzing the functional blocks of an IC design such that the memory requirement for storing the information of the functional blocks of the IC design is reduced as well as a decrease in run time.

An advantage of the present invention is that it provides a method for creating and using a shell to retain critical information from a functional block of an IC design where the shell represents the functional block in the rule checking process of other connected blocks.

Another advantage of the present invention is that it provides a method for creating and using a shell such that in the static rule checking process of another block connected to the created shell, the rule checking process would still be valid.

Still another advantage of the present invention is that it provides a method for creating and using shells representing functional blocks of an IC design such that in the rule checking process, minimal amount of memory is needed to process the functional blocks.

Still another advantage of the present invention is that it provides a method for creating and using shells representing functional blocks of an IC design such that only a minimal amount of computer run time is needed.

These and other objects and advantages of the present invention will no doubt become obvious to those of ordinary skill in the art after having read the following detailed description of the preferred embodiments.

IN THE DRAWINGS

FIGS. 1–5 illustrate various scenarios of circuits in functional blocks and the circuit information retained for the corresponding shells.

FIGS. 6a, 6b, and 6c illustrate three examples of interconnections between blocks.

DETAILED DESCRIPTION OF THE PREFERRED EMBODIMENT

A shell representing a block must contain all the circuitry information necessary to accommodate valid rule checking of other interconnected blocks.

Specifically, the shell of a block must provide the following information accurately: input and output nets, fanin and fanout information, pin-to-pin connections between two connected blocks, input and output cells, and path information.

In static rule checking, the connectivity between the designated paths, nets, pins, and cells are traced. The traced information is compared against a set of rules, and a violation of the rules is flagged. In order to trace the connectivity, the design rule checker requires information regarding the connections of the input and output paths of every connected block and the paths through the block.

In the generation of a shell for a functional block, the general concept is to retain all the circuit information from the input paths of the block to storage elements in the block (if any), and from the output paths of the block back to storage elements in the block (if any). If there are no storage elements in the block, all the circuit information in the block is retained in the shell. Note that input and output paths are referred to as input ports and output ports.

Figure 1:
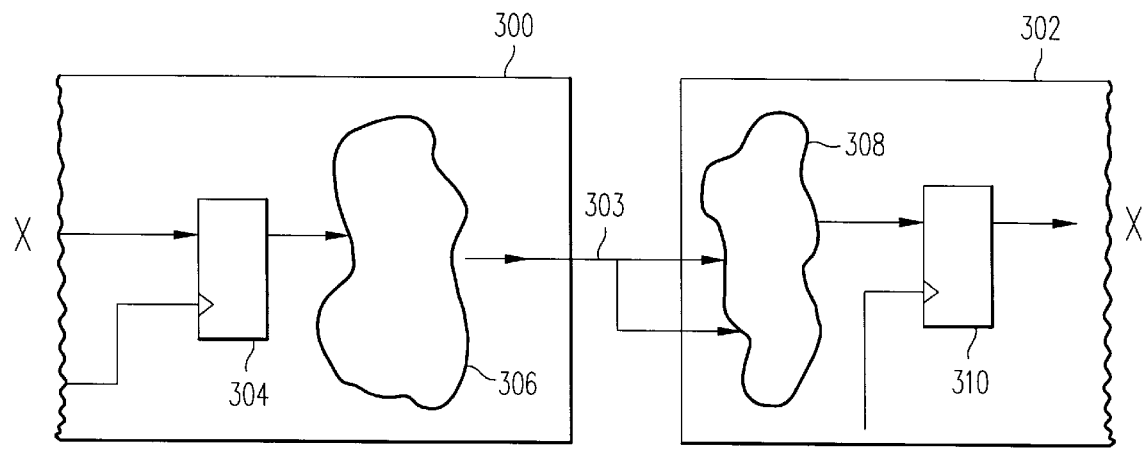

To illustrate the circuit information that is retained in a shell, various scenarios are illustrated by FIGS. 1–5. Referring to FIG. 1, a block 300 is shown connected to another block 302 via connection 303. Block 300 contains a storage element 304 (a flip-flop) that is connected to a "cloud" 306, where a cloud represents a group of cells without any storage element. Cloud 306 provides an output path which is converted to two input paths to cloud 308 of block 302, and cloud 308 is connected to a storage element 310. All the elements illustrated in FIG. 1, i.e. cells 304 and 310, clouds 306 and 308, are retained in a shell by the shell generation process of the present invention described below. All the information between the two flip-flops are retained because the design rule checker has to analyze the circuitries between the two flip-flops.

Figure 2:
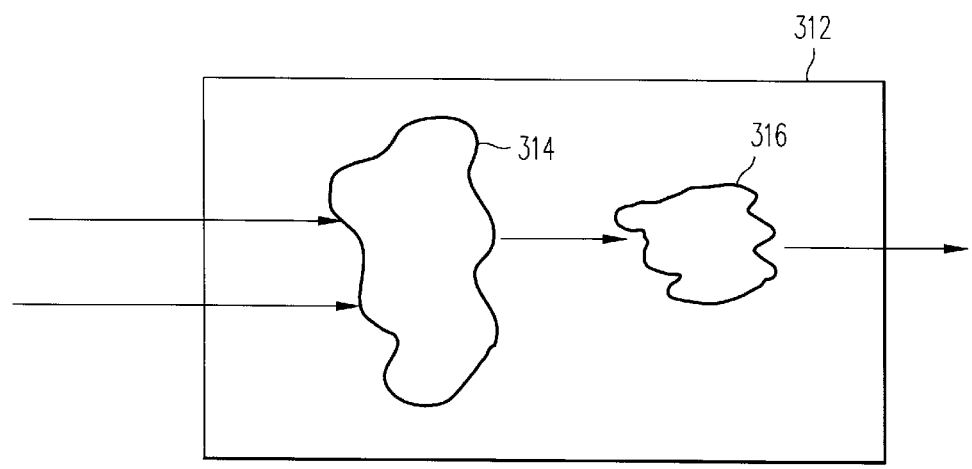

FIG. 2 illustrates a complete block 312 containing a cloud 314 with two input paths and a cloud 316 with an output path. All the circuit information in this block is retained in a shell because there are no storage elements in this path.

Figure 3:
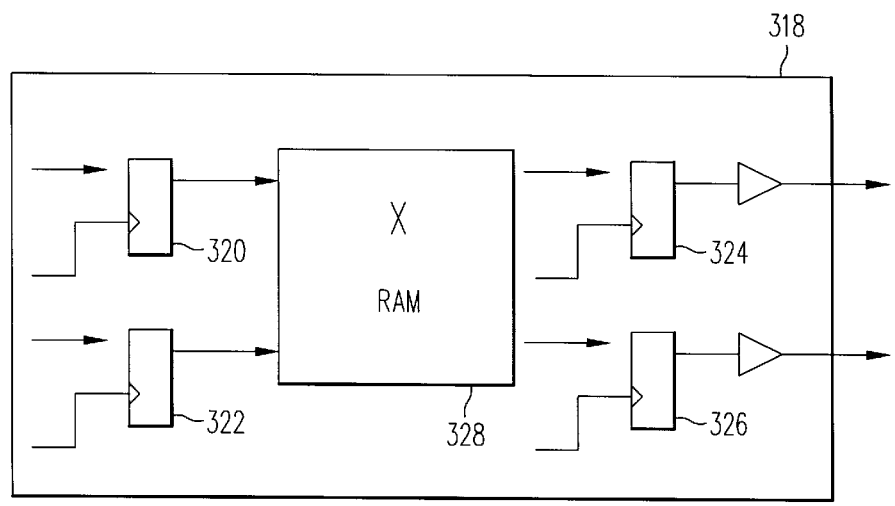

Referring to FIG. 3, a block 318 is shown containing four flip-flops 320, 322, 324, and 326, and a memory cell 328. In accordance with the present invention, the four flip-flops are retained in a shell while memory cell 328 is not retained. For memory cells having direct connections in and out of a block (such as a port for inputting a write pulse), the memory cells would have to be preserved.

Figure 4:
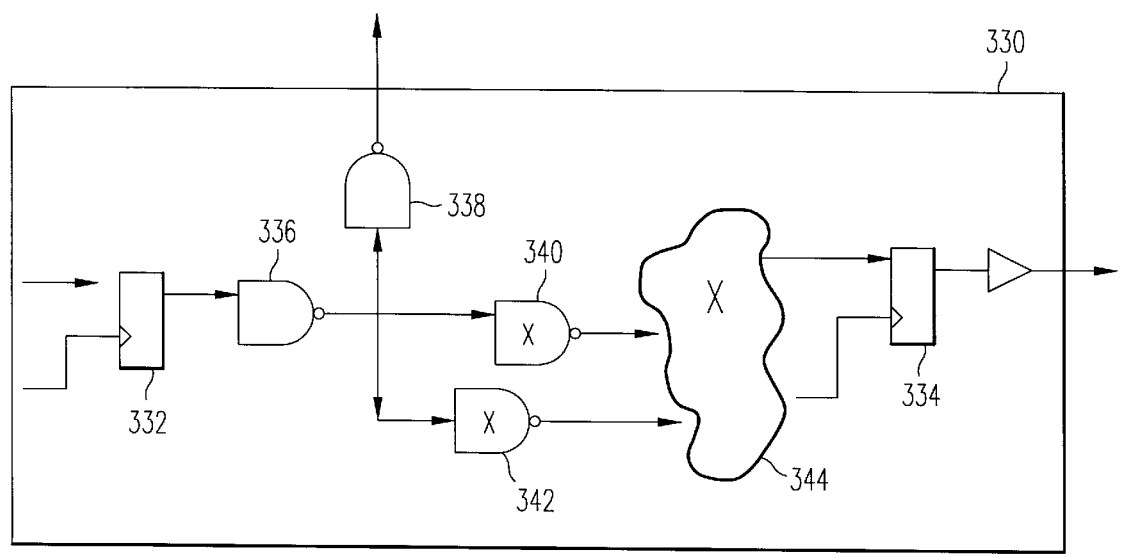

FIG. 4 illustrates a block 330 containing flip-flops 332, 334, four NAND gates 336, 338, 340, 342, and a cloud 344. In this case where the output of an internal flip-flop is connected across the block boundary through one or more gates, such as in the case of gates 336 and 338, these gates will have to be preserved.

Figure 5:
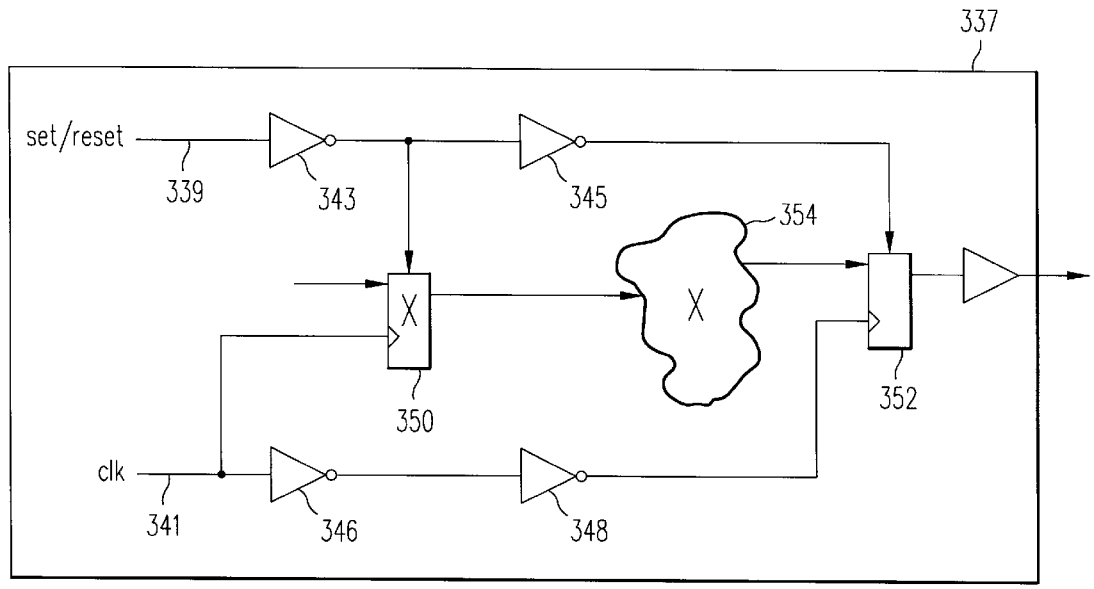

Referring to FIG. 5, block 337 contains a set/reset line 339, a clock line 341, four inverters 343, 345, 346, 348, two flip-flops 250, 252, and a cloud 254. As a general rule, clock lines and set/reset lines are kept in their entirety. Here, at least one flip-flop (cell 252) on the clock distribution logic and set/reset distribution structure should be kept. The flip-flop is needed to check for a gated clock, merging of a clock and set/reset, merging of data and clock, and merging of set/reset with a data pin on the path. Since we are only concerned about problems originating from outside the shell, only one flip-flop is needed.

Figure 6A:
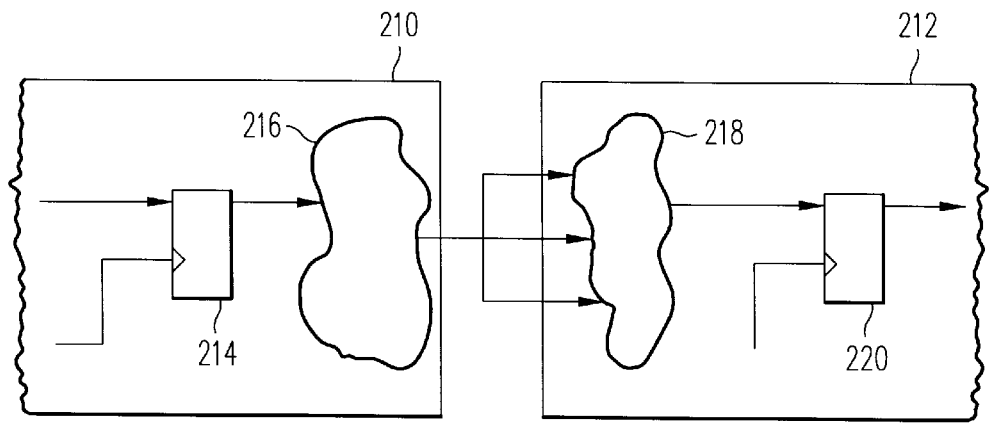
Figure 6B:
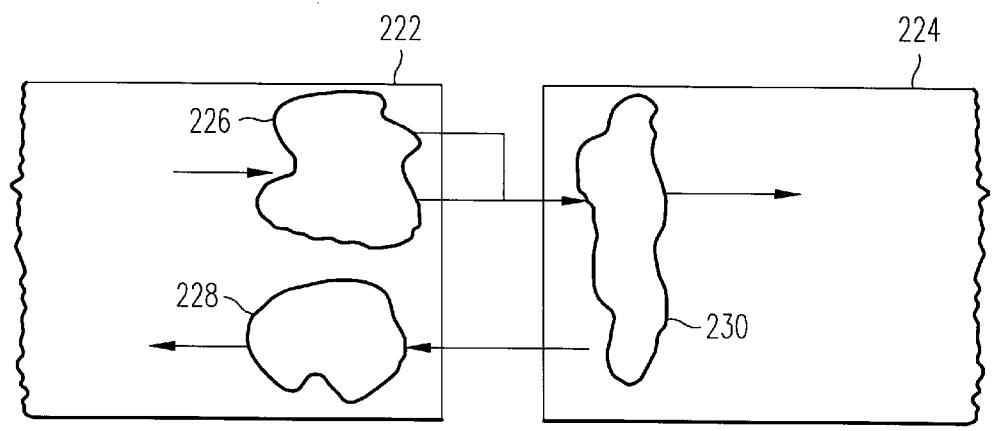
Figure 6C:
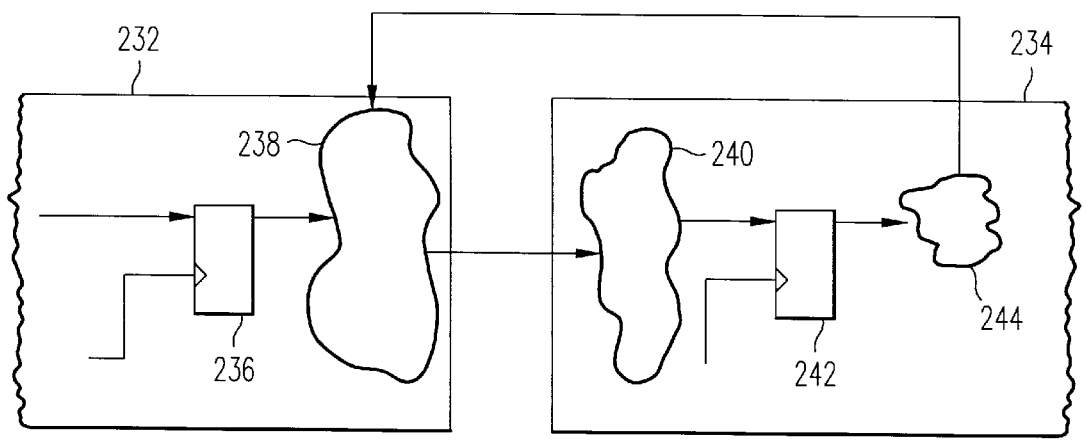

FIGS. 6a, 6b, 6c further illustrate various types of interconnections between blocks. Referring to FIG. 6a, block 210 is connected to block 212 where a storage element 214 is connected to cloud 216. Cloud 216 provides an output path for block 210 which is connected to block 212 to cloud 218. Cloud 218 is connected to a storage element 220. Note that cell 214, cloud 216, cloud 218 and cell 220 are all kept in the design shell generation process. Referring to FIG. 6b, block 222 contains two clouds 226 and 228. Cloud 226 provides an output for block 222 which is an input to cloud 230 of block 224. Cloud 230 of block 224 provides an input to cloud 228 of block 222. Note that in the design shell generation process, the three clouds, 226, 228, and 230, will be retained in their respective shells. Referring to FIG. 6c, block 232 has a storage element 236 connected to a cloud 238. The cloud provides an input to cloud 240 of block 234, which provides an input to cell 242. Cell 242 provides an input to cloud 244 of block 234, and this cloud provides an input path to cloud 238 of block 232. Note again that in the design shell generation process, cell 236 and cloud 238 of block 232 will be retained and clouds 240, 244, and cell 242 of block 234 will be retained.

Generally speaking, the elements of a net list representing a block that needs to be preserved in order to retain properties of the original block include: gates on the path with direct connection to input and output ports (no storage element in the path), latches are treated as flip-flops (storage elements), at least one flip-flop on the clock net, set_reset net, and any connected input of a combination of cells caused by removing the driving cell must be tied to a logic.

Figure 7:
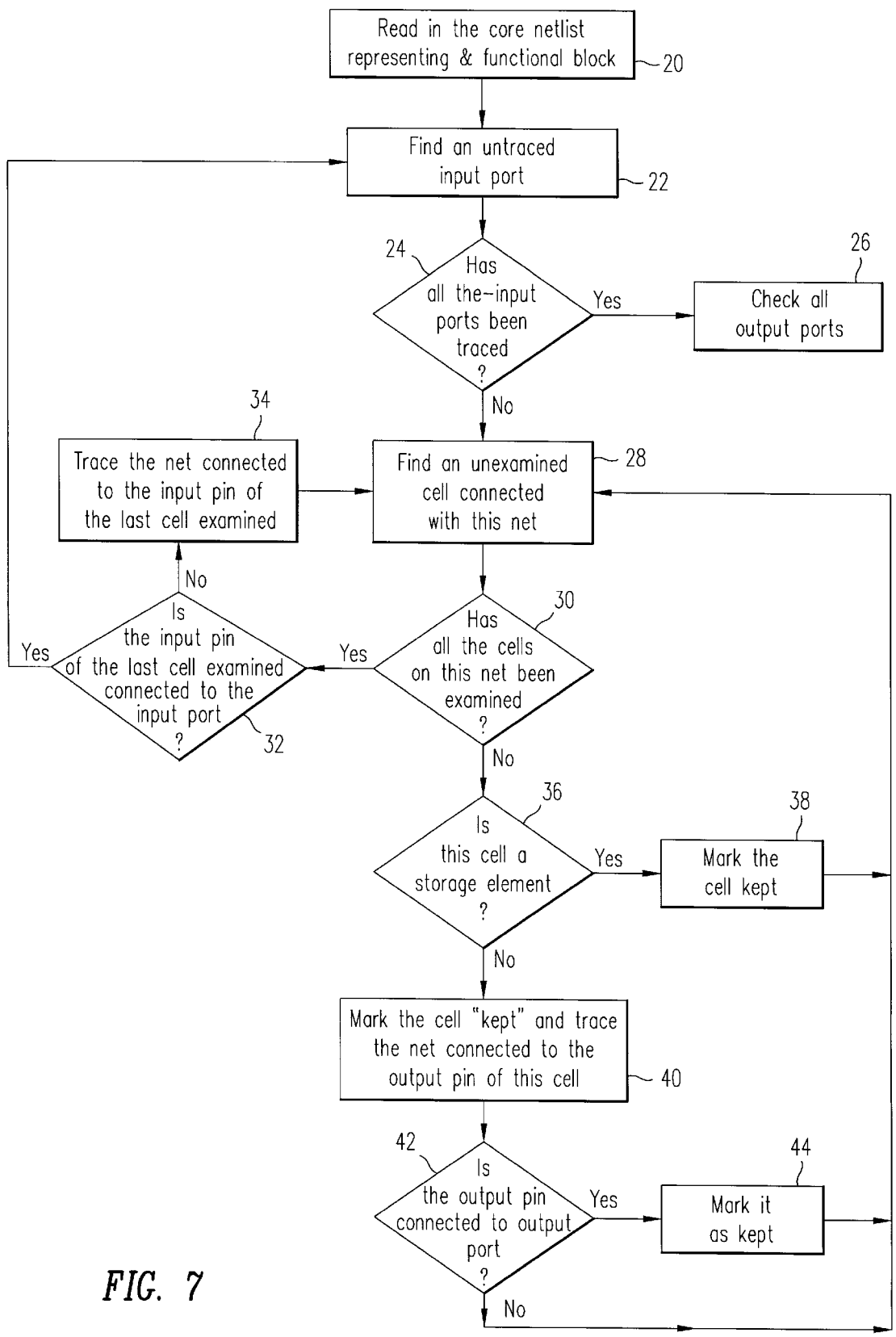
FIG. 7 is a flow chart illustrating the steps in analyzing the input ports of a block in the shell generation process.

In creating a shell for a functional block, referring to FIG. 7, the analysis begins with the input ports of the block. First, the "net list" representing the functional block is read in as indicated at 20. From the net list, an untraced input port is searched for processing (22). If all the input ports have been traced, the shell creation process moves on to check all the output ports of the functional block as indicated at 26. If not all the input ports have been traced (an untraced input port was found), an unexamined cell connected to this net is searched (28), where "this net" refers to the net currently being processed in relation to the cell (or input port, output port, etc.) being examined or just examined. If all the cells on this net have been examined (30) and if one of the input pin(s) of the last cell examined is connected to the input port (32), this input port has been completely processed and the next untraced input port is searched as indicated at 22. If all the cells on the net have been examined (30) but none of the input pin(s) of the last cell just examined is connected to the input port (32), there are still cells between the cell just examined and the input port. Thus, it is necessary to trace the net connected to the input pin of the last cell examined (34). If all the cells on this net have not been examined (30) and if the cell is a storage element (36), the cell is needed for the shell and is marked as kept (38). The shell generation process then returns to box 28 to examine the next unexamined cell connected to this net. If, per test 36, this cell is not a storage element, the cell is kept as part of the shell and the net connected to the output pin of this cell is traced (40). If the output pin is connected to an output port (42), the cell is marked as kept (44). If the output pin is not connected to an output port (42), the shell generation process continues to find an unexamined cell connected to this net 28. This process recursively forward traces the net(s) connected to the input pin(s) and output pin of a cell to find a storage element or an output port to gather the necessary circuit information for the shell.

Figure 8:
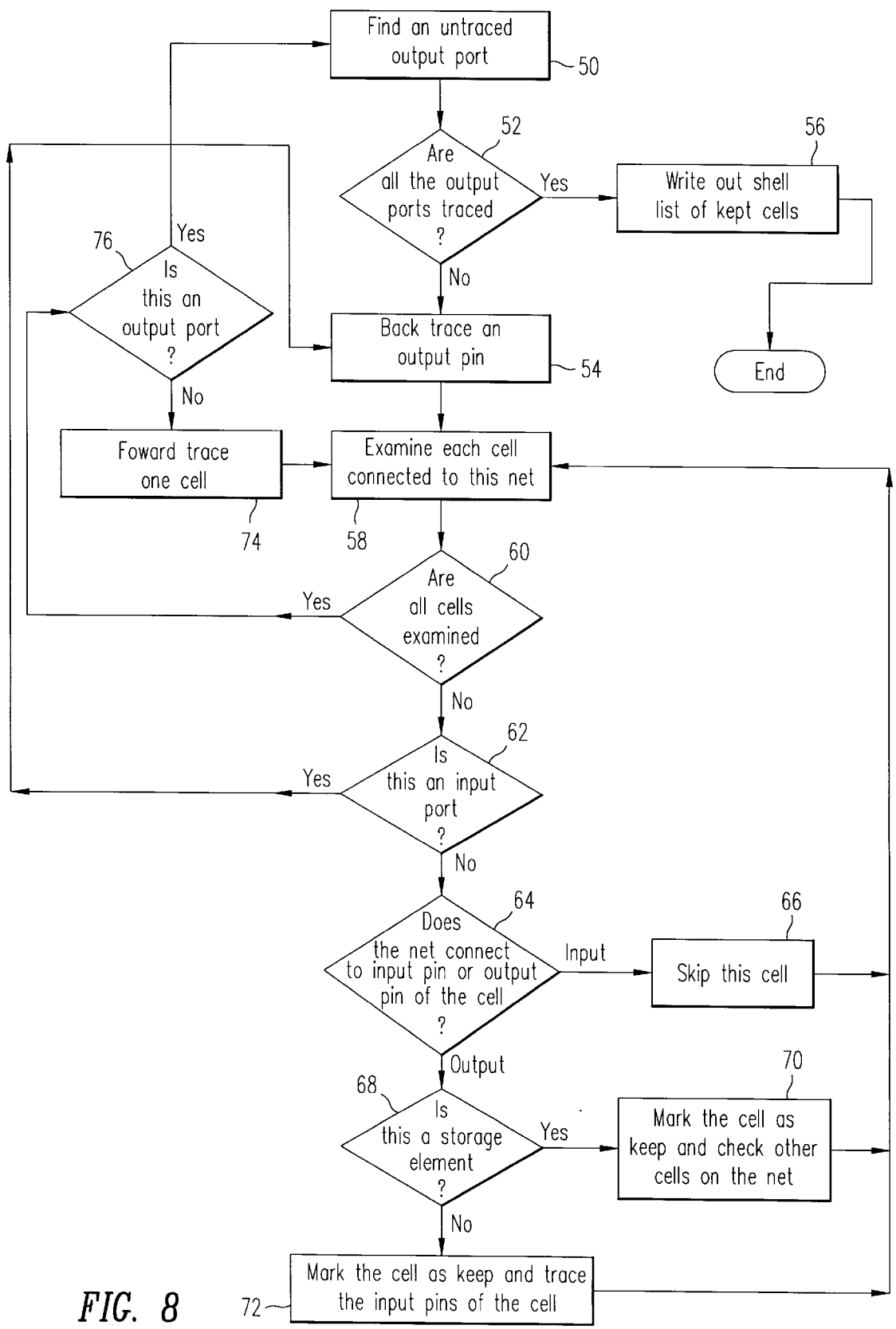
FIG. 8 is a flow chart illustrating the steps in analyzing the output ports of a block in the shell generation process.

Referring to FIG. 8, a process to back trace from the output ports of a functional block is illustrated. This process follows the completion of the process of checking the input ports (box 26 of FIG. 7). First, an untraced output port is selected (50). If all the output ports have been traced (52), the list of kept cells is written out (56) and this list defines the shell representing the block. If not all the output ports have been traced (52), from an untraced output port, this net is back-traced (54) and an unexamined cell connected to this net is searched (58). If all the cells on this net have been examined (60), and if this net is connected to an output port (76), then this output port has been completely processed and the next untraced output port is processed (50). If all the cells have been examined (60) but the net is not connected to an output port (76), the shell generation process forward traces one cell (74) and examines all the cells connected to the net (58). If all the cells have not been examined (60) and the net is connected to an input port (62), the shell generation process back-traces an output pin to the input pins of the examined cell (54). If the net is not connected to an input port (62), and if the net is connected to an input pin of the cell (64), the cell is skipped (66) and another cell connected to this net is examined by repeating step 58. If the net is found to be connected to an output pin of the cell (64) and if the cell is determined to be a storage element (68), the cell is marked as indicated at 70 and other cells on this net are checked (58). If the cell under test is not a storage element (68), the cell is marked as kept, the input pins of this cell are traced (72), and the and the cells connected to the net of the input pins are examined (58). The cell generation process ends when all of the output ports of the block have been traced.

The result of the shell generation process is a net list of all the cells kept, and this net list is generally a much smaller subset of the original net list of the block.

Figure 9:
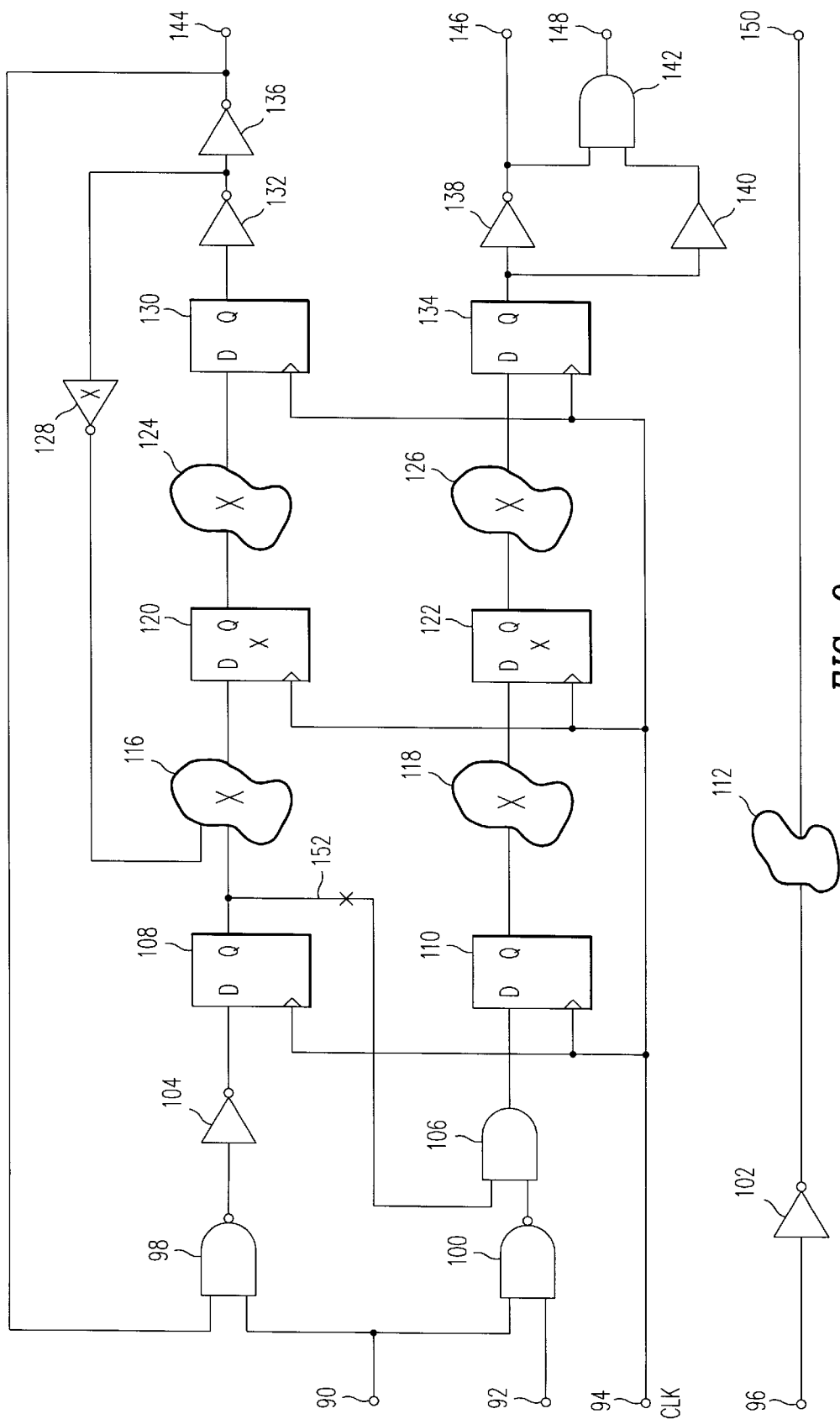
FIG. 9 illustrates a circuit in a block and the circuit information that is retained for a corresponding shell.

FIG. 9 provides an illustration of the shell generation process with regard to the cells that are kept for a particular functional block by the shell generation process. Cells that are not marked as kept are indicated by an 'X'. Starting with an input port at 90, cell 98 is examined. Since cell 98 is not a storage element, it is marked as kept and cell 104 is examined. Since cell 104 likewise is not a storage element, it is marked as kept and cell 108 is examined. Cell 108 is a storage element and it is marked as kept. Cloud 116 being after the storage element is not examined and is not marked. After marking cell 108, the process back traces to the net before cell 104 and back traces to the net connected to the input pin of cell 98. Since the input pin of cell 98 is connected to an input port, the examination of this net is completed. Returning to the examination of cell 100 which is also connected to input port 90, cell 100 is marked as kept. Cell 106 is marked as kept and the net connected to one of the input lines to cell 106 is not kept since it is connected to a group of cells that are not marked. Cell 110, being a storage element, is marked as kept. Cells represented by cloud 118 are after a storage element and therefore are not examined and are not marked. After marking storage element 110 the process back traces to the net before cell 106 and then back traces to the net before cell 100. This completes the examination of input port 90. Input port 92 is examined next. Note that since the cells connected to input port 92 are the same as one part of the net of input port 90, the same result is obtained and the examination process may be skipped for this port. Input port 94 is a clock line. Note that all clock lines and reset lines are kept in their entirety (except as noted above). Thus, input port 94 and the connected nets are marked as kept. Input port 96 connects to cell 102 which is connected to a group of cells represented by cloud 112 and outputs to output port 150. This entire net, cell 102 and cloud 112, are kept.

After all the input ports have been examined, the shell generation process analyzes the output ports. Looking at output port 144, cell 136 is back traced, examined, and marked as kept. Cell 132 is then back traced, examined, and marked as kept. Back tracking to cell 130, cell 130, being a storage element, is marked as kept. Cell 128, being connected after cell 132 and before a group of cells represented by cloud 116, is not kept. After cell 130 is marked, the shell generation process forward traces to cell 132 and forward traces to cell 136 and cell 128 to return to output port 144.

In examining output port 146, cell 142, being connected to the net of output port 146, is examined and marked as kept. Cell 138 is examined and back-traced and marked as kept. Cell 140 is examined and marked as kept, and cell 134 being a storage element is marked as kept. Cells represented by cloud 126, being before storage element 134, are not examined and are not kept. The process now forward traces back to cell 138 and output port 146.

In back tracing output port 148, cell 142 is examined and marked as kept. Cell 138 is already examined and marked, and cell 134 (already examined) being a storage element is marked as kept and the process forward traces to cell 138 and back to cell 142. Then the other input pin to cell 142 is examined where cell 140 is examined and marked as kept. Again, cell 134 is already examined and found to be a storage element and marked as kept. Then, the process forward traces to cell 140, cell 142, and output port 148. In examining output port 150, it is found that the cells of this net have been examined and marked as well. Note that we have described the process in accordance to the illustrated flow chart, and many optimization readily apparent to a person skilled in the art can be made. For example, if all the pins of a cell have been examined, that cell may not need to be examined again.

Hierarchial Design Rule Checking Methodology

Figure 10:
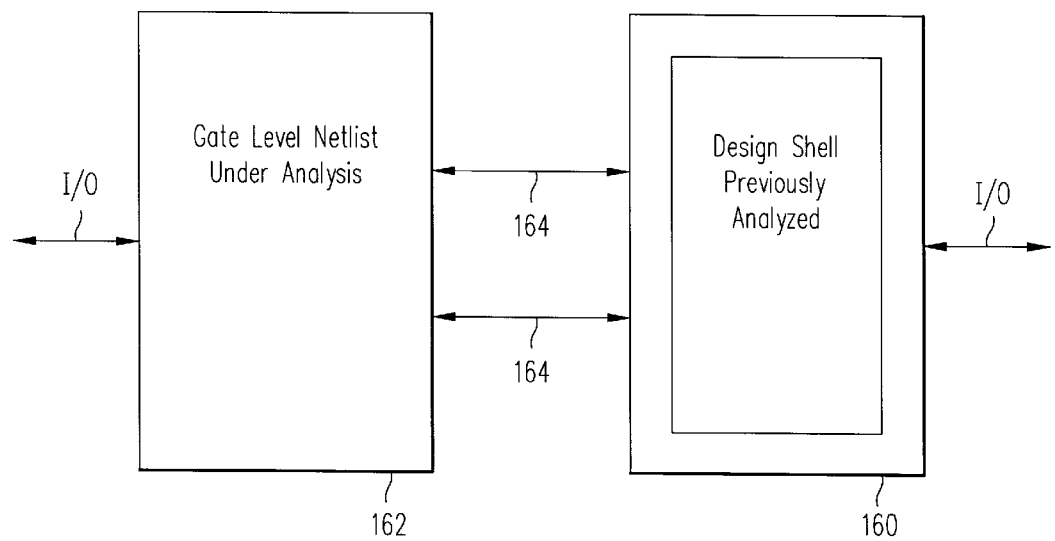
FIG. 10 shows a block under analysis connected to the shell of another block previously analyzed.
Figure 11:
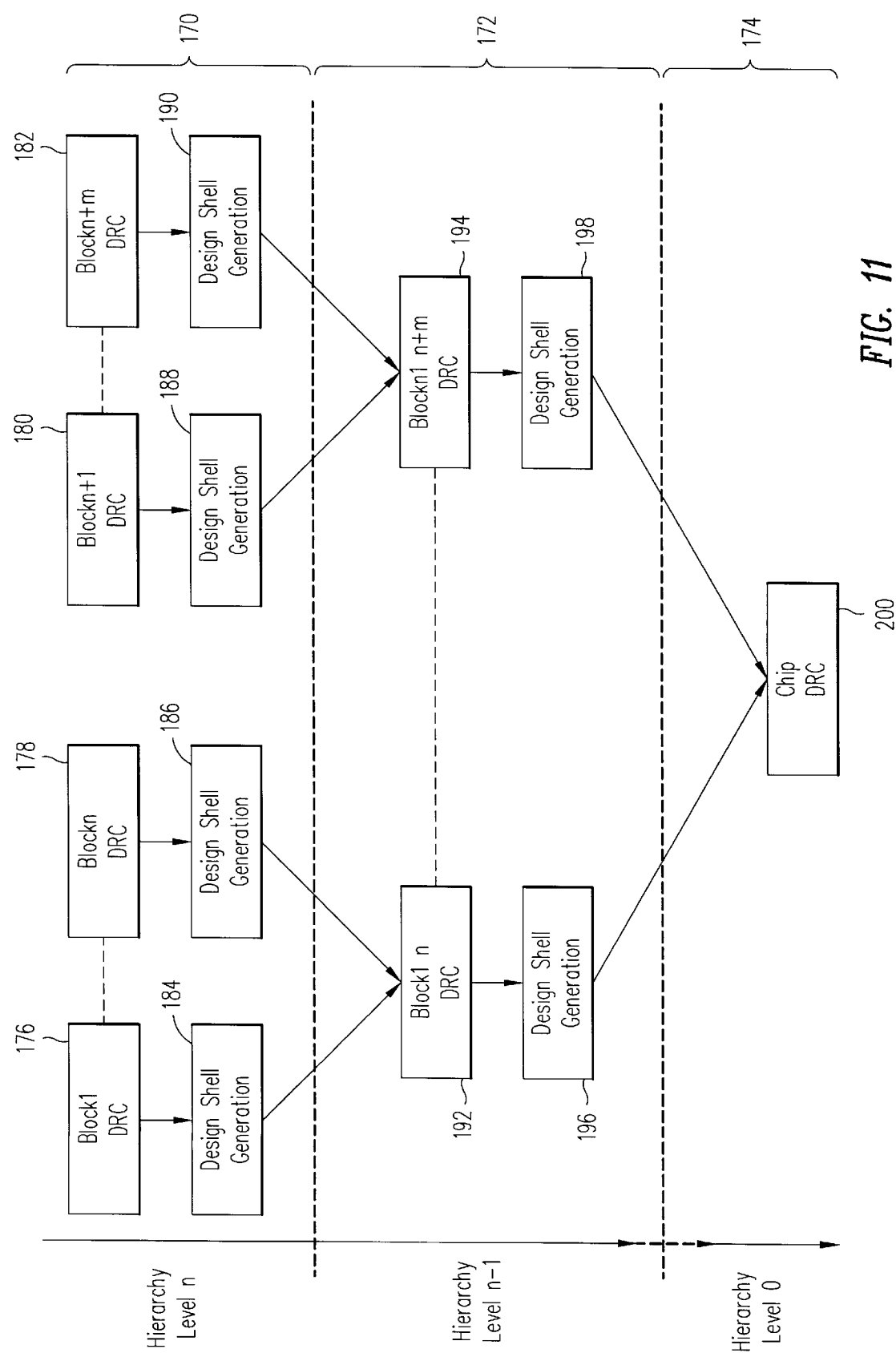
FIG. 11 illustrates a hierarchical design rule checking process.

Referring to FIG. 10, after a block has been design rule analyzed and a shell 160 is generated, the next block 162 at the same level in the hierarchy undergoes the same design rule analysis and shell generation process. Block 160 is illustrated as a shell where only the pertinent information that is necessary for the analysis of other blocks, as determined by the above described process, is retained. The block being analyzed 162 is connected to block 160 through interconnections 164. When the design analysis process and shell generation process are completed for block 162, other blocks at the same level in the hierarchy are analyzed. This process is repeated for each of the blocks at the same level and is illustrated by FIG. 11.

When all the blocks at a level have been design rule checked and the shells generated, the process moves up one level in the hierarchy where blocks from the previous level are combined to form new interconnected blocks, and the process repeats for each of the blocks at that level in the hierarchy. For example, each of the blocks 176, 178, 180, 182, undergoes the design rule checking process. After the completion of the design rule checking process for each of the blocks, a shell is generated 184, 186, 188, 190. When all the blocks at this level have been design rule checked and shells have been generated, the process continues to the next level 172, where each block at this level (192 and 194) is comprised of one or more blocks from the previous level, and each block undergoes the design rule checking process and the shell generation process to generate shells 196, 198. Finally, at the highest level 174, the design shells from the previous level representing the functional blocks are combined to form a single block and the block undergoes the design rule checking process 200.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What I claim is:

1. A method for analyzing an integrated circuit design composed of a plurality of interconnected functional blocks each containing circuit information for the integrated circuit design, comprising the steps of:

a) analyzing a first block of the integrated circuit design for compliance with predefined design rules, said first block being interconnected with one or more other interconnected blocks;

b) generating a first shell representing said first block, where said first shell contains circuit information describing circuit elements within said first block between the input ports of said first block leading to storage elements and output ports of said first block, and between the output ports of said first block leading to storage elements and input ports of said first block; and c) analyzing a second block connected to said first block of said integrated circuit design for compliance with the predefined design rules using the circuit information in said first shell.

2. A method as recited in claim 1 further including the steps of:

d) generating a second shell representing said second block; and e) combining said first shell and said second shell into a first combined block of a first level.

3. A method as recited in claim 2 further including the steps of:

f) repeating steps c) and d) for the one or more other interconnected blocks to generate a corresponding shell for each of the one or more other interconnected block; and g) combining the shells for the one or more other interconnected blocks into one or more combined blocks of said first level.

4. A method as recited in claim 3 further repeating steps a), b), c), d), e), f), and g) for the first level combined blocks of said first level to create one or more combined blocks of a second level.

5. A method as recited in claim 1 wherein a block has one or more input ports and one or more output ports and the shell of said block is generated by the substeps of:

1) tracing and retaining circuit information from each of the input ports of a block to one or more respective storage elements in said block if the one or more respective storage elements are found, and to one or more respective output ports of said block if no storage elements are found in the traced circuit information;

2) back tracing and retaining circuit information from each of the output ports of said block to one or more respective storage elements, and to one or more respective input ports if no storage elements are found in the traced circuit information; and wherein the retained circuit information defines the shell representing said block.

6. A method for creating a shell representing a block of an integrated circuit design interconnected with one or more other interconnected blocks, where a block has one or more input ports and one or more output ports, comprising the steps of:

1) tracing and retaining circuit information from each of the input ports of a block to one or more respective storage elements in said block if the storage elements are found, and to one or more respective output ports of said block if no storage elements are found in the traced circuit information;

2) back tracing and retaining circuit information from each of the output ports of said block to one or more respective storage elements in said block if the storage elements are found, and to one or more respective input ports if no storage elements are found in the traced circuit information; and wherein the retained circuit information defines the shell representing said block.

7. A method for analyzing an integrated circuit design composed of a plurality of interconnected functional blocks each containing circuit information for the integrated circuit design, comprising the steps of:

a) analyzing each of the blocks of an integrated circuit design for compliance with predefined design rules, each block being interconnected with one or more other interconnected blocks;

b) generating a shell representative of each of the blocks, where each shell contains circuit information describing circuit elements within said first block between the input ports of said first block leading to storage elements and output ports of said first block, and between the output ports of said first block leading to storage elements and input ports of said first block; and c) selectively combining shells representative of selected blocks to form one or more combined blocks.

8. A method as recited in claim 7 further including the step of:

d) repeating said steps a), b), and c) using all of the blocks to further form further combined blocks until all of the blocks are combined into one block representative of the integrated circuit design.

9. A method as recited in claim 7 wherein a block has one or more input ports and one or more output ports and the shell of said block is generated by the substeps of:

1) tracing and retaining circuit information from each of the input ports of a block to one or more respective storage elements in said block if the one or more respective storage elements are found, and to one or more respective output ports of said block if no storage elements are found in the traced circuit information;

2) back tracing and retaining circuit information from each of the output ports of said block to one or more respective storage elements, and to one or more respective input ports if no storage elements are found in the traced circuit information; and wherein the retained circuit information defines the shell representing said block.

* * * * *